United States Patent [19]

Iden et al.

[11] Patent Number: 4,618,694

[45] Date of Patent: Oct. 21, 1986

[54] PERYLENE COMPOUNDS

[75] Inventors: Rüdiger Iden, Speyer; Günther Seybold, Neuhofen, both of Fed. Rep. of Germany

[73] Assignee: BASF Aktiengesellschaft, Rheinland-Pfalz, Fed. Rep. of Germany

[21] Appl. No.: 690,524

[22] Filed: Jan. 11, 1985

[51] Int. Cl.$^4$ ............................................. C07C 121/64
[52] U.S. Cl. ............................... 558/416; 252/301.35; 252/582; 427/157; 558/420
[58] Field of Search .................... 260/465 D; 558/416

[56] References Cited

U.S. PATENT DOCUMENTS 3,557,218  1/1971  Hall et al. ........................ 260/465 H
4,110,123  8/1978  Goetzberger et al. ........ 136/89 HY
4,379,934  4/1983  Graser et al. ........................... 546/37
4,492,648  1/1985  Claussen ............................... 252/582

FOREIGN PATENT DOCUMENTS 2512516  9/1976  Fed. Rep. of Germany .
2851513  6/1980  Fed. Rep. of Germany .
 254310 10/1926  United Kingdom .

*Primary Examiner*—Dolph H. Torrence
*Attorney, Agent, or Firm*—Oblon, Fisher, Spivak, McClelland & Maier

[57] ABSTRACT

The present invention relates to a method for concentrating light by means of fluorescent compounds in plastic sheets or films, wherein perylene compounds are used for this purpose.

6 Claims, No Drawings

PERYLENE COMPOUNDS

The present invention relates to a method for concentrating light by means of fluorescent compounds in plastic sheets or films, wherein perylene compounds are used for this purpose.

German Laid-Open Application DOS Nos. 3,001,857, 2,620,115 and 2,554,226 disclose apparatuses in which visible light in a plastic sheet can be concentrated over a small area by means of incorporated fluorescence centers.

The compounds required as fluorescence centers in these apparatuses must be very lightfast, particularly in the case of the conversion of light energy to electrical or thermal energy, so that the apparatuses have lives which are sufficiently long for the particular application, ie. the compounds used as fluorescence centers must possess high photostability in the plastics used.

It is known that derivatives of perylene-3,9-dicarboxylic acid, being fluorescence centers of sufficient quantum efficiency, can be used for concentrating light, but these compounds have the disadvantage of being insufficiently photostable, for example in polymethyl methacrylate.

It is an object of the present invention to provide compounds which are suitable fluorescence centers for the conventional apparatuses for concentrating light, and which possess a high fluorescent quantum efficiency coupled with good lightfastness in the medium used and do not have any adverse effect on the medium.

We have found that this object is achieved, and that excellent results are achieved when light is concentrated over a particular area with the aid of fluorescence centers in plastic sheets or films, if the fluorescence centers used are perylene compounds of the formula (I)

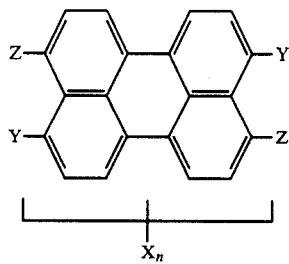

(I)

where
X is halogen,
n is 0, 1 or 2, and either
one radical Y is cyano and the other is cyano or halogen and
Z is —COOR$^1$, where
R$^1$ is hydrogen, straight-chain or branched C$_1$–C$_{18}$-alkyl,
C$_5$–C$_{18}$-cycloalkyl-substituted C$_1$- or C$_2$-alkyl or C$_7$–C$_{18}$-cycloalkyl, and the cycloalkyl radicals can contain from 1 to 4 rings, or
Y is cyano and
Z is cyano, halogen or hydrogen, and the two radicals Z can be identical or different.

In the plastics used for producing the sheets or films required for light concentration, the perylene compounds (I) used according to the invention give very lightfast colorations which convert the incident light to fluorescent light with high efficiency. The wavelength of the fluorescent light is from 450 to 550 nm.

Preferred perylene compounds for the novel process are those of the formula (I) where X is chlorine or bromine, n is 0, 1 or 2, and either both radicals Y are cyano and Z is cyano, halogen, preferably bromine or chlorine, or hydrogen, and the two radicals Z can be identical or different, or one radical Y is cyano and the other is cyano or halogen, preferably bromine or chlorine, and both radicals Z are —COOR$^1$, where R$^1$ has the above meanings.

The preferably used perylene compounds are of the formulae (II), (III) and (IV):

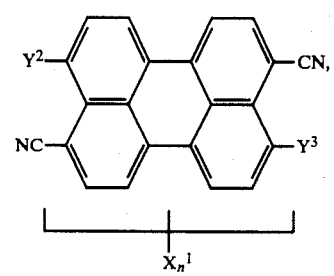

(II)

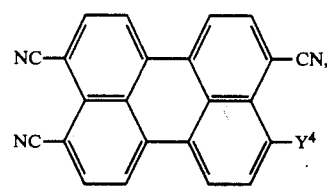

(III)

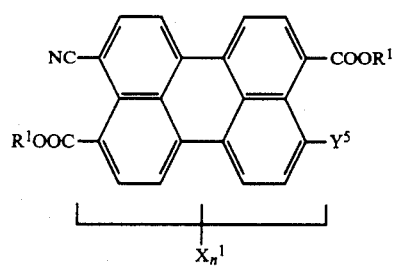

(IV)

In the formulae (II), (III) and (IV), X$^1$ is chlorine or bromine, n is 0, 1 or 2, Y$^2$ and Y$^3$ independently of one another are each hydrogen, cyano or halogen, preferably chlorine or bromine, Y$^4$ is bromine or cyano, Y$^5$ is cyano or halogen, preferably chlorine or bromine, and R$^1$ is hydrogen, straight-chain or branched C$_1$–C$_{18}$-alkyl or C$_5$–C$_{18}$-cycloalkyl-substituted C$_1$- or C$_2$-alkyl or is C$_7$–C$_{18}$-cycloalkyl, and the cycloalkyl radicals can contain from 1 to 4 rings.

R$^1$ is preferably C$_4$–C$_{18}$-alkyl, in particular n-butyl, isobutyl, neopentyl, 2-ethylhexyl, n-octyl, tridecyl or octadecyl.

Particularly preferred perylene compounds are those of the formulae (III) and (IV).

The compounds of the formula (IV) are novel. Accordingly, the present invention furthermore relates to novel perylene compounds of the formula (IV) where X$^1$ is chlorine or bromine, n is 0, 1 or 2, Y$^5$ is cyano or halogen, and R$^1$ is hydrogen, straight-chain or branched C$_1$–C$_{18}$-alkyl, C$_7$–C$_{18}$-cycloalkyl or C$_5$–C$_{18}$-cycloalkyl-substituted C$_1$- or C$_2$-alkyl.

Among the perylene compounds (IV), particularly preferred ones are those of the formula (V)

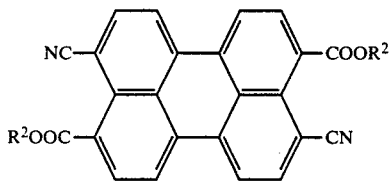

where $R^2$ is straight-chain $C_4$–$C_{18}$-alkyl, preferably n-butyl, neopentyl, isobutyl, 2-ethylhexyl, n-octyl, n-tridecyl or n-octadecyl.

The processes for the preparation of the compounds (I) are known, and the novel perylene compounds (IV) are prepared by a conventional method.

The compounds (I) are used by incorporating them into plastics (media) which are suitable for the particular application. To do this, the plastic, in the form of granules, is powdered with the required amount of (I), and the granules are then extruded to give sheet-like structures. Sheet-like structures colored with (I) can also be obtained by dipping the said structures into a solution of (I), the compound (I) diffusing into the plastic. In another possible method, the (I)-containing monomers or monomer mixtures are polymerized to give a plastic. Sheet-like structures can also be produced by casting from a solution which contains the plastic and the compound (I) in dissolved form.

Examples of plastics (media) which can be used for concentrating light, eg. for solar cells, are polymethyl methacrylate, polymethyl acrylate, polystyrene and polydiethylene glycol diallyl biscarbonate, as well as polycarbonates and nylons which are suitable for this purpose.

The Examples which follow illustrate the invention. Parts and percentages are by weight.

PMMA = polymethyl methacrylate
Sulfolane = tetrahydrothiophene 1,1-dioxide.

EXAMPLE 1

(a) 12 parts of 3,4,9,10-tetrabromoperylene (obtained by bromination of perylene in nitrobenzene) and 18 parts of copper cyanide in 100 parts of sulfolane were heated at 160°–170° C. for 14 hours. The reaction mixture was precipitated on 500 parts of ice, the mixture was filtered under suction and the residue was digested with 1000 parts of 10% strength ammonia solution, filtered off under suction, washed with water and dried.

Extraction with chloroform gave 5 parts (57% of theory) of 3,4,9-tricyano-10-bromoperylene, which can be purified further by chromatography.

$C_{23}H_8N_3Br$ (M. 405.9): Br. calculated: 19.3 found: 18.8%

Mp. 235°–237° C.

(b) 0.01 part of the perylene compound obtained as described in (a) was incorporated into 1000 parts of PMMA. The resulting coloration had an absorption maximum at 465 nm and an emission maximum at 516 nm.

EXAMPLE 2

(a) 10 parts of the perylene compound obtained as described in Example 1 were again reacted with copper cyanide by the method state in Example 1.

Yield: 8 parts of 3,4,9,10-tetracyanoperylene.

$C_{24}H_8N_4$ (M 352): N: calculated: 15.9 found: 15.4%

Mp. 285°–287° C.

Fluorescent quantum efficiency (in chloroform): 83%.

(b) This dye was incorporated into PMMA (concentration: 0.01%); the resulting coloration exhibited a brilliant yellowish green fluorescence, and the quantum efficiency was greater than 80%.

Absorption maximum: 474 nm
Emission maximum: 505 nm (c) For the sheet obtained by extrusion, the decrease in extinction at $\lambda_{max}$ ($\Delta Ext\lambda_{max}$) was determined by exposure in a XENOTEST ®apparatus for 168 hours at an illumination of 200,000 lux and using a daylight filter. $\Delta Ext\lambda_{max}$ was 3%.

EXAMPLE 3

3,9-Dicyanoperylene was incorporated into PMMA (concentration: 0.05%) and the mixture was cast to give sheets. The absorption maximum of the system was at 462 nm and the emission maximum at 498 nm.

EXAMPLE 4

(a) 12 parts of isobutyl 4,10-dibromoperylene-3,9-dicarboxylate and 9 parts of copper cyanide in 100 parts of sulfolane were stirred for 25 hours at 130° to 140° C.

The reaction product was precipitated by pouring the mixture onto 400 parts of water, the precipitate was filtered off under suction and the residue was digested in dilute ammonia, filtered off under suction, washed neutral with water and dried. Extraction with toluene gave 9 parts of a crude dye containing 1.2% of bromine.

The dye was purified by medium pressure column chromatography over silica gel, using trichloroethane/ethanol as the eluent.

Yield: 6 parts of isobutyl 4,10-dicyanoperylene-3,9-dicarboxylate

Mp. 228°–230° C.

Fluorescent quantum efficiency (in chloroform): 91%.

(b) This dye was incorporated into PMMA (concentration: 0.05%). The absorption maximum was at 474 nm and the emission maximum at 508 nm.

After exposure for 168 hours (cf. Example 2c)), $\Delta Ext\lambda_{max}$ was 4%.

EXAMPLES 5 TO 10

The procedure described in Example 4 was followed, except that, instead of isobutyl 4,10-dibromoperylene-3,9-dicarboxylate, an equivalent amount of the esters stated in the Table was used.

The resulting crude esters were purified by column chromatography.

The absorption maximum and emission maximum of the esters were determined on colorations obtained using a concentration of 0.05% in PMMA.

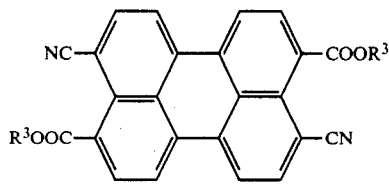

| Example | $R^3$ | Absorption maximum (PMMA) [nm] | Emission maximum (PMMA) [nm] |
|---------|-------|----------------|---------------|
| 5 | $-CH_2-CH_2-CH_2-CH_3$ | 474 | 509 |
| 6 | $-CH_2-C(CH_3)_2-CH_3$ | 474 | 508 |
| 7 | $-CH_2-CH(C_2H_5)-n\text{-}C_4H_9$ | 474 | 509 |
| 8 | $-n\text{-}C_8H_{17}$ | 474 | 508 |
| 9 | $-n\text{-}C_{13}H_{27}$ | 473 | 508 |
| 10 | $-n\text{-}C_{18}H_{37}$ | 474 | 507 |

We claim:

1. A perylene compound of the formula

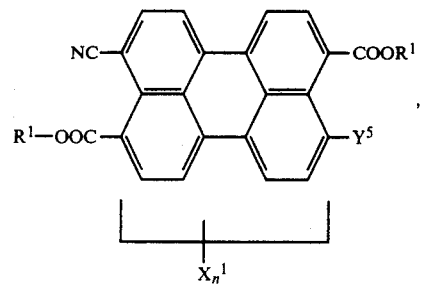

where
- $Y^5$ is halogen or cyano,
- $R^1$ is hydrogen, straight-chain or branched $C_1$–$C_{18}$-alkyl or $C_5$–$C_{18}$-cycloalkyl-substituted $C_1$- or $C_2$-alkyl or is $C_7$–$C_{18}$-cycloalkyl, and the cycloalkyl radicals can contain from 1 to 4 rings,
- $X^1$ is chlorine or bromine and
- $n$ is 0, 1 or 2.

2. A perylene compound as claimed in claim 1, wherein $Y^5$ is chlorine, bromine or cyano.

3. A perylene compound as claimed in claim 1, which is of the formula

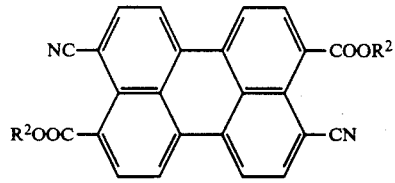

where $R^2$ is straight-chain or branched $C_4$–$C_{18}$-alkyl.

4. A perylene compound as claimed in claim 1, wherein, in the formula, $R^1$ is n-butyl, isobutyl, neopentyl, 2-ethylhexyl, n-octyl, n-tridecyl or octadecyl.

5. A perylene compound as claimed in claim 2, wherein, in the formula, $R^1$ is n-butyl, isobutyl, neopentyl, 2-ethylhexyl, n-octyl, n-tridecyl or octadecyl.

6. A perylene compound as claimed in claim 3, wherein $R^2$ is n-butyl, isobutyl, neopentyl, 2-ethylhexyl, n-octyl, n-tridecyl or octadecyl.

* * * * *